United States Patent [19]

Cichanski

[11] Patent Number: 5,036,284
[45] Date of Patent: Jul. 30, 1991

[54] MONITOR CIRCUITS FOR BATTERY CHARGING AND OTHER APPLICATIONS

[76] Inventor: Frank J. Cichanski, 904 Duncan Ave., Elgin, Ill. 60120

[21] Appl. No.: 465,378

[22] Filed: Jan. 16, 1990

[51] Int. Cl.$^5$ ............................................. G01N 27/46
[52] U.S. Cl. ....................................... 324/433; 320/48
[58] Field of Search ............... 324/426, 427, 433, 434, 324/435; 320/48; 340/636

[56] References Cited

U.S. PATENT DOCUMENTS

| | | | |
|---|---|---|---|
| 3,680,072 | 7/1972 | Charbonnier et al. | 324/433 X |
| 4,388,618 | 6/1983 | Finger | 320/48 X |
| 4,521,735 | 6/1985 | Kageyama et al. | 324/433 |
| 4,740,754 | 4/1988 | Finger | 320/48 X |
| 4,947,124 | 8/1989 | Hauser | 320/48 X |

*Primary Examiner*—Kenneth A. Wieder
*Assistant Examiner*—Robert W. Mueller
*Attorney, Agent, or Firm*—Kinzer, Plyer, Dorn, McEachran & Jambor

[57] ABSTRACT

A monitoring circuit for a battery charger, with utility in other applications, includes a main input that receives an initial signal such as the terminal voltage of a battery being charged, and a two-stage comparator, each stage preferably an operational amplifier. The initial signal is applied to the inverting input of the first stage, which is a differencing amplifier that also serves as a gain block; the initial signal is also delayed a brief interval, typically more than a second, and then applied to the non-inverting input of the first stage of the comparator. The inverting input of the second stage of the comparator receives the same signal as the non-inverting input to the first stage, whereas the non-inverting input to the second stage is derived from the output of the first stage. The output of the second stage varies in amplitude and polarity to define trends in the initial signal direction and magnitude and, in a battery charger, allows accurate charging to a peak with virtually no overcharge or undercharge problems.

28 Claims, 1 Drawing Sheet

MONITOR CIRCUITS FOR BATTERY CHARGING AND OTHER APPLICATIONS

BACKGROUND OF THE INVENTION

Rechargeable batteries, most notably nickel-cadmium (NiCad) batteries, are increasingly being used for heavy applications such as portable power tools. They have enjoyed a rather long history as a standard power cell for moderate to heavy loads, as in power supplies for remote radio equipment in police, fire, emergency medical, and other communications, particularly vehicular communications. In all of these cases, rapid charging capability is desirable. The technology of NiCad batteries has progressed quite well, so that their electrochemistry and physical properties are capable of supporting rapid charging.

The conventional recommended method for charging NiCad batteries has been the "ten hour" cycle; a cell or battery that is rated to give up its full power at the maximum recommended drain rate over a ten hour period is charged at that same current but over a fourteen hour period. The additional charge time is expected to make up for charging inefficiencies. Ostensibly, this cycle matches well the eight hour shifts of users who might employ these batteries in radio communications. Unfortunately, this rhythm is a virtual fantasy. Portable radio transceivers produce a quite limited drain while receiving, especially in a squelched standby mode, but constitute heavy loads during transmission. The so-called "ten hour" cycle usually overcharges or undercharges the NiCad battery, and usually does not discharge the battery to near its exhausted state, so that fourteen hours of unattended charging damages the battery. Also, mobile or portable radio equipment is not usually in excess availability at its typical sites of usage; successive work shifts inherit the equipment with the batteries in an unknown state of charge or utilize replacement batteries that have also been subjected to an unknown service cycle.

A fully discharged battery usually produces a very low output voltage. Although its voltage increases rapidly at the onset of charging, due to its high internal impedance when discharged, and the availability of charging current from the charger across that impedance, nonetheless the total excursion of the battery voltage, even ignoring the rapid rise in the first moments, can be several volts. The actual rate of change of the voltage, ignoring the first moments in the case of a fully discharged battery, is nonetheless fairly small, even for high charging rates. The battery acts to "swamp out" radical changes, acting somewhat as a voltage "buffer". The ideal voltage of the chemical system of the battery is quite fixed; the small changes seen during charging are largely an effect of internal impedance changes.

The total excursion of a battery's voltage during charging, even ignoring the initial rapid slewing of voltage when charging a totally discharged battery, can be substantial; it can be several volts for a multi-cell battery. But the actual absolute voltage is a poor indicator of charge, considering things such as age and previous duty cycle. As an example, consider a hypothetical twenty-four volt battery in a state of absolute discharge. A voltmeter placed across it reads essentially zero volts.

When charging starts, the battery voltage rises within seconds to some fairly high voltage, say nineteen volts. This might be the case even if less than a ten-thousandth of its capacity had been restored in the initial seconds of charging. Over a succeeding period, presuming a rapid charging cycle, the battery voltage rises, at a fairly steady rate, from nineteen volts to some final peak voltage, somewhere between twenty-two and twenty-six volts. The specific peak voltage is determined by a number of factors, such as the specific chemistry of the battery, its age, its designed current delivery capacity, and the nuances of internal impedance that are influenced by prior usage cycles. Therefore, measurement of its output voltage is not a good clue as to its state of charge.

Even using a controlled rate of charge (a constant, controlled current, no matter the required voltage), there is no way to be sure that a given amount of charging time is adequate or excessive to charge the battery fully, since it cannot be known what the original degree of discharge was, nor the degree of efficiency of charging, nor for that matter the particular full charge capacity (consider both low and high capacity batteries of the same voltage, and the differences in capacities of batteries of even the same nominal capacity). Neither time nor voltage is a good indicator of charging completion.

Moreover, in typical usage (e.g., a power tool) a heavy duty cycle battery is exhausted rapidly, sometimes in substantially less than an hour, and then rapidly charged, often in an even shorter time. The extreme charging currents employed can be catastrophic to the battery (and hazardous to personnel, the charging equipment, and other local equipment) unless there is a good method for assessing the battery's state of charge, with concomitant careful management of the charging cycle.

There are a number of other strategies for charging NiCad batteries. An old "standby" is the trickle charge. This regime uses a voltage equal to or very slightly higher than the fully charged voltage of the ideal battery. The available current is limited so that even if the battery is almost fully discharged, the initial current is not excessive. This limited current charges the battery quite slowly. As the battery voltage rises, there is a higher back e.m.f. so that the charging current decreases. Theoretically, at full charge the current is so reduced as to be unable to damage the battery by overheating. By this time, also, the voltage differential is theoretically small enough to be well below the required hydrolysis voltage of the electrolyte (typically an aqueous solution), so that gas due to hydrolysis should not form. The problems of this trickle system are many. Two most serious are that: (1) the rate of charge is dismally low, rendering this method suitable only for low-current standby systems; and (2) as batteries age, their terminal voltage changes. Even if great care is taken to trim the maximum available charging voltage to the original optimum level, this becomes incorrect for older batteries.

A related method is voltage-tapered charging, which is similar to trickle charging except that less impedance is used to limit the initial current. This provides a faster early charge than trickle charging. In a similar way, the differential between the maximum available charging voltage and the battery's own voltage is depended upon to reduce the current automatically as the battery proceeds to charge. Because of the lower circuit impedance, the user is relied upon to terminate the charge cycle. The effect of aging battery terminal voltage is more pronounced in this type of charger, so that overcharge damage can be severe without the user's intervention. Many so-called "ten hour" (fourteen hour charge) systems actually rely on this method.

Other systems charge a battery in an essentially non-tapered manner, and depend upon sensing of the battery voltage or sensing of a rise in battery temperature to signal the end of a charge cycle. For old batteries, or those that have gone through irregular charge/discarge cycles, the voltage at the battery terminals at full charge can be subject to a substantial shift from that which is expected, making the simple voltage-sensing method unreliable and sometimes quite dangerous. The thermal cut-off approach can be relatively reliable in carefully controlled environments (where random external cooling is not a factor), but is less than effectual because it usually relies upon the battery becoming undesirably overheated before cut-off is performed, thereby actually promoting a diminution of battery service life and power delivery ability. In the case of modern extremely rapid charge cycles, the current is so high that a battery can be seriously damaged before the build-up of internal heat can be reliably sensed and used to stop the charge cycle.

One property of secondary cells, not exclusive to the NiCad systems, can be, and has been exploited to get around these difficulties. This involves the behavior of these electrochemical cells as they approach and begin to pass the peak charge point. A minute drop in terminal voltage occurs, rather than a continual increase. The voltage drop is due to a combination of effects, ostensibly electrode polarization and some thermal effects. This occurs quite a bit earlier than a rise in external temperature, and before cell damage has occurred. The key is to sense this change in a reliable, versatile, and inexpensive manner. Factors affecting reliability are those that rest upon making this determination in spite of battery characteristics such as age or prior duty cycle, and without regard to errors caused by circuitry calibration, drift, or leakage. Factors affecting versatility concern the ability to perform this feat for widely differing cell types and chemistries and even greatly differing battery voltages (e.g., the ability to charge a 6 volt battery with the same equipment as a 9 or 12 volt battery).

Mobile battery packs are routinely used. The acts performed range from simple communications and local vital signs monitoring, to bio-telemetry of this information, and certain critical applications such as ventricle defibrillators for delivery of rather high powered, but carefully regulated dosages of electrical shock for cardiopulmonary resuscitation. In specialized cases, remote x-ray, bio-chemical analysis by electronic instrumentation, and even medical ultrasound examination is performed. To insure the fitness of the battery system, advanced measures are not spared, and microprocessor based systems, often already present within the equipment, are employed to monitor and control the charge of the battery pack. This is performed by frequently and periodically converting the measured battery voltage to a digital value that is stored and compared to subsequent measurements of that same quantity during charge.

If intelligently programmed, such a system can be "smart" enough to ignore treacherous variables such as battery age, specific chemistry, prior history, and even specific battery voltage, in order to tailor an appropriate and optimal charge cycle. In an expensive instrument, it is practical to interface electronics to extract from existing components the functionality that would otherwise cost too much to implement in a microprocessor-based stand-alone battery charger. Unfortunately, this option is not available for the user of a cordless drill or walkie-talkie.

Somewhat less expensive alternatives of this "slope-delta inflection" method have also been effected. A ramp-generator-cum-feedback with comparator and logic circuitry solution has been proposed. In this case, essentially no attention was paid to the case of improper use, such as an attempt to charge an already-charged battery, or the peculiarities of the response of older or mis-cycled cells. The actual circuitry was also complex and ill-suited to generalization. Other methods are conceivable, such as the use of sample-and-hold circuitry. These usually require a circuit topology that is highly dependent upon the leakage of a long-time-constant RC network, especially since the period of measurement extends over many seconds of time, and must be responsive to a few tens of millivolts versus a battery voltage that may range to several tens of volts. In addition, the necessity to perform the sample-and-hold function spawns an entire order of complexity that can be shown to be avoidable.

SUMMARY OF THE INVENTION

It is a principal object of the invention, therefore, to provide a new and improved monitor circuit for use in a battery charger or in other applications that effectively identifies the direction and magnitude of excursions of an input signal and that is simple and inexpensive in construction and safe and versatile in operation.

Accordingly, in one aspect the invention relates to a charge monitor circuit for monitoring variations in the terminal voltage of an electrical energy storage device comprising one or more storage cells in order to control charging of the storage device from a charge circuit supplying a charging current thereto, at least by interrupting the charging current when the storage device reaches a predetermined state of charge, the monitor circuit comprising a main input, connectable to the storage device, for receiving an iniitial signal indicative of the present terminal voltage of the storage device, and comparator circuit means, having first and second inputs and an output, for comparing two input signals to develop an output signal representative of the relationship between the two input signals. First connection means are provided for connecting the main input to the first input of the comparator circuit means to apply the initial signal thereto; there are also delay means for delaying a signal for a predetermined brief time interval and second connection means for connecting the main input through the delay means to the second input of the comparator circuit means to apply a delayed initial signal thereto. The comparator output is connectable to the charge circuit.

In another aspect, the invention relates to a monitor circuit for monitoring variations in an initial signal with respect to direction and amplitude, as a function of time, comprising a main input for receiving an initial signal, and comparator circuit means, having first and second inputs and an output, for comparing two signals to develop an output signal representative of the relationship between the two input signals. First connection means are provided for connecting the main input to the first input of the comparator circuit means to apply the initial signal thereto; there are also delay means for delaying a signal for a predetermined brief time interval and second connection means for connecting the main input through the delay means to the second input of the comparator circuit means to apply a delayed initial signal thereto.

DESCRIPTION OF THE PREFERRED EMBODIMENTS

Figure 1:
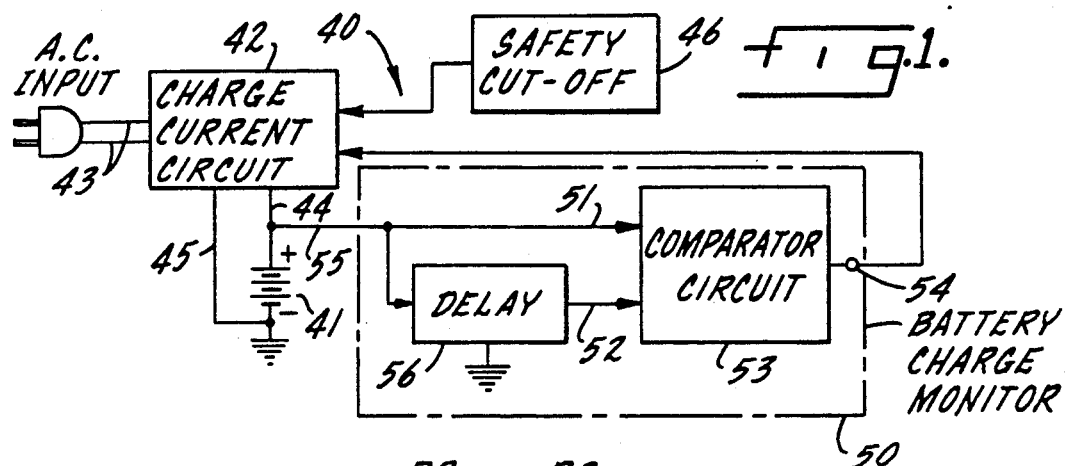
FIG. 1 is a block diagram of a battery charging system that includes a charge monitor circuit constructed in accordance with the present invention.

FIG. 1 affords a block diagram of a battery charger 40 that incorporates a monitor circuit 50 constructed in accordance with the present invention. Apart from monitor circuit 50, battery charger 40 may be generally conventional in construction. The charger is utilized to charge an electrical energy storage device 41, which may be a single electrical energy storage cell or a battery of such cells. Typically, storage device 41 is a plural-cell NiCad battery, though charger 40 could also be used to charge other electrochemical storage devices.

Battery charger 40 includes a rectifier and charge current circuit 42 having an AC input 43. The charge current circuit 42 has two output terminals 44 and 45 that are connected to the positive and negative terminals, respectively, of storage device 41. In the illustrated circuit, the negative terminal of the battery 41, and the charge terminal 45 that is connected to it, are grounded. The charge current circuit 42 preferably is of the kind that can supply a constant charge current to storage device 41. Battery charger 40 may include a safety cut-off circuit 46 connected to circuit 42 to afford a means for interrupting charging operation as a safety precaution.

The battery charge monitor circuit 50 of FIG. 1 includes a comparator 53 having a first input 51, a second input 52, and an output 54. Comparator circuit 53 is capable of comparing two input voltages, supplied to its inputs 51 and 52, to produce an output voltage signal at its output 54 that is representative of the relationship between the two input voltage signals. Thus, the output signal at comparator circuit terminal 54 may change polarity to indicate which of the two input signals, on inputs 51 and 52, is of greater magnitude, at a given polarity than the other. The amplitude of the output signal at an internal terminal 58 may (FIG. 2) also afford an indication of the amplitude difference between the input signals.

The battery charge monitor circuit 50 of FIG. 1 includes a main input 55 that is connectable to one terminal of storage device 41 to receive an initial voltage signal indicative of the present terminal voltage of device 41. In FIG. 1, input 55 is connected to the positive terminal of battery 41 but it could just as easily be connected to the negative terminal if the positive terminal of the battery were grounded for charging. Monitor circuit 50 includes a first connecting circuit that connects its main input 55 to the first input 51 of comparator circuit 53. Thus, in the circuit of FIG. 1 the input signal representative of the present terminal voltage for storage device 41 is supplied directly to the first comparator input 51.

Monitor circuit 50 of FIG. 1 also includes a delay circuit 56 that has an input connected to the main input 55 of the monitor circuit. Circuit 56 is typically an RC circuit capable of delaying an input voltage signal for a predetermined brief time interval, usually substantially longerer than one second. Monitor circuit 50 further includes a second connection means effectively connecting the output of delay circuit 56 to the second input 52 of comparator circuit 53. Thus, in monitor circuit 50 the main input 55 is effectively connected through delay circuit 56 to the second comparator input 52 to apply a delayed initial voltage signal to the second comparator input.

The output 54 of battery charge monitor circuit 50, FIG. 1, is connected back to charge current circuit 42. The output signal from comparator 53, which is representative of the relationship between the undelayed and delayed voltage terminal signals from device 41, is thus applied to the rectifier and charge current circuit for control of operation of that circuit. More explicitly, the output signal from terminal 54 may be utilized to interrupt operation of circuit 42 and thereby stop the charging of the battery or other electrical storage device 41.

Figure 2:
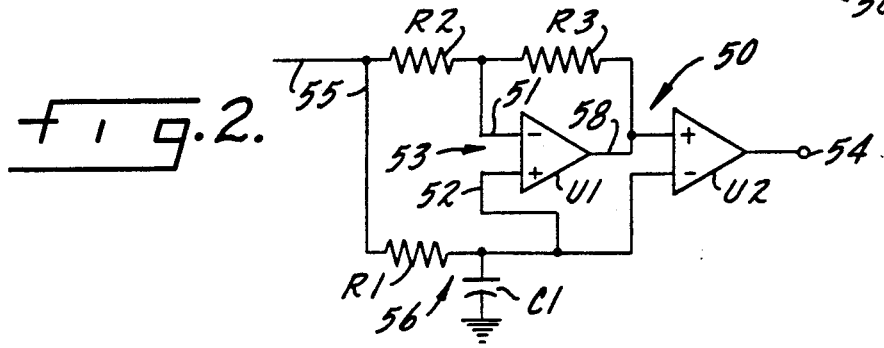
FIG. 2 is a schematic diagram of one embodiment of the monitor circuit of FIG. 1.

Before reviewing operation of battery charger 40 and its monitor circuit 50, FIG. 1, more specifically, it is desirable to consider a specific embodiment for monitor circuit 50; see FIG. 2. In the construction shown in FIG. 2, the comparator circuit 53 of monitor 50 includes two operational amplifiers U1 and U2. U1 is operated as a differencing amplifier; U2 does the actual comparison. The negative polarity input of amplifier U1 comprises the first comparator circuit input 51 and is connected to the main input 55 of monitor 50 by a resistor R2. A resistor R3 is connected from terminal 51 to the output 58 of Op-Amp U1. Output 58 is also connected to the positive polarity input of Op-Amp U2. The output of amplifier U2 is the output 54 for the battery charge monitor circuit 50.

In monitor circuit 50, in the specific form shown in FIG. 2, delay circuit 56 comprises a series resistor R1 and a shunt capacitor C1. Resistor R1 connects the main input 55 of monitor 50 to capacitor C1, which is returned to ground. The delay circuit R1, C1 is connected to terminal 52, which is the positive polarity input for Op-Amp U1. It is also connected to the main input terminal 55.

Considering now the operation of FIG. 1 as modified to include the monitor circuit 50 shown in FIG. 2, it is seen that an initial signal indicative of the present terminal voltage of device 41 is supplied directly to the inverting (−) input 51 of operational amplifier U1. This same initial signal is delayed by the delay circuit 56 comprising resistor R1 and capacitor C1 and, after delay, is supplied to the non-inverting (+) input 52 of the same operational amplifier U1. Thus, the input signal supplied to the inverting input of circuit U1 always represents the immediate value of the terminal voltage for storage device 41, whereas the signal supplied to the non-inverting input of device U1 is delayed by a fixed time interval, determined by the time constant of the delay circuit 56, comprising R1 and C1.

While storage device 41 is charging, the voltage on the main input 55 to monitor circuit 50 changes; at all times it is indicative of the terminal voltage of the storage device. The voltage across resistor R1 is the difference between that voltage and the voltage on capacitor C1. The voltage across R1 determines the amount of current that acts to alter the charge on capacitor C1. The cumulative integral of that current over time thus varies the charge on the capacitor and hence varies the signal voltage that appears at the non-inverting input 52 of operational amplifier U1. This second, delayed input to the comparator circuit 53 of monitor 50 and the specific way that it is utilized provide for effective operation by monitor 50 in control of circuit 42.

In the circuit of FIG. 2, the delayed initial signal voltage supplied to the non-inverting input 52 of operational amplifier U1 serves as a varying reference voltage in that circuit; it serves the same purpose in the second operational amplifier U2. Whereas no calibration or other setting of a simpler circuit could null out the effects of age, charge rate, prior duty cycle, and the like for storage device 41, the specific way in which this second input or reference signal is supplied to the particular comparator circuit shown in FIG. 2 performs this multi-aspect function. That is, the use of this same reference voltage in both stages U1 and U2 of comparator circuit 53, FIG. 2, makes it possible to correct for several different variables, any one of which might have a substantial adverse effect upon the determination of final charge for storage device 41, all on a continuous basis.

To correct for inaccuracies in subsequent stages of comparator circuit 53, particularly stage U2, and to modify the quite minute changes of output voltage for storage device 41 so that those changes will be more manageable, amplifier U1 functions as a gain block. The gain is provided by the ratio of resistors R2 and R3. In effect, the difference between the signals appearing at the inputs 51 and 52 of amplifier U1 is amplified in accordance with the ratio R3/R2. This amplified difference is added to the voltage at the non-inverting input and it is this sum which appears at the output 58 of device U1. This signal, at point 58 in the circuit, of course serves as one of the inputs (non-inverting) to comparator amplifier U2. The other input to U2 is the delayed "reference" voltage signal, the same signal that is supplied to input 51 of device U1.

Operational amplifier U2 in FIG. 2 serves as a comparator. Alternatively, the second stage of circuit 53 could be an integrated circuit unit that is specifically tailored to perform a comparator function; actually, there is little to be gained by making that change because an ordinary operational amplifier performs the comparator duty quite well. A dual operational amplifier chip, readily available commerically, can be used for devices U1 and U2 in monitor circuit 50 as shown in FIG. 2; furthermore, the very high input impedance that can be found in FET-input operational amplifiers is a distinct advantage in the illustrated circuit.

As a result of the gain provided by the ratio R3/R2, the variation of the output signal from amplifier U1, indicative of on-going changes in the terminal voltage of battery 41 during charging, can be made arbitrarily large. This gain R3/R2 may be referred to as the gain of the first or slope-detecting stage U1 of comparator circuit 53. Thus, the output of the first operational amplifier U1 may be expressed as:

$$V58 = VC1 - \frac{R3}{R2}(V55 - VC1) \quad (1)$$

In the next stage of comparator 53, amplifier U2, this voltage at terminal 58 is compared with the pseudo-reference voltage, the delayed input signal that has been supplied to the inverting input of opertional amplifier U2. If the voltage on capacitor C1 is less than the output voltage at terminal 51, then the output of amplifier U2 is of negative polarity or is at or near ground potential if that is the most negative voltage in the system. When the voltage on capacitor C1 rises above the voltage at terminal 51, it is because the terminal voltage of battery 41 (FIG. 1) has fallen below that impressed upon capacitor C1, indicating a downturn of the battery terminal voltage and a consequent upturn of the output voltage of amplifier U1, at output 58. In these circumstances, the output 54 of operational amplifier U2 goes positive. This positive signal, supplied to change current circuit 42, may be utilized as an indication that the charging of storage device 41 must be interrupted.

In an ideal situation, comparator 50 (FIG. 2) could be constructed without the gain-adjusting feedback provided by the ratio of resistors R3 and R2 so that operational amplifier U1 itself would function as a comparator, eliminating the need for the second stage U2. However, many factors mitigate against this simpler arrangement, particularly as regards reliability. First, the offset voltage present in operational amplifier U1, no matter how small, could spoil operation of comparator 50, causing false interruption of battery charging. There would also be no direct control over the degree of negative slope that would be acceptable as a cutoff indication for the charging operation. These factors are mitigated by the use of the two-stage circuit, using amplifiers U1 and U2, as illustrated in FIG. 2 and as described above.

Figure 3:
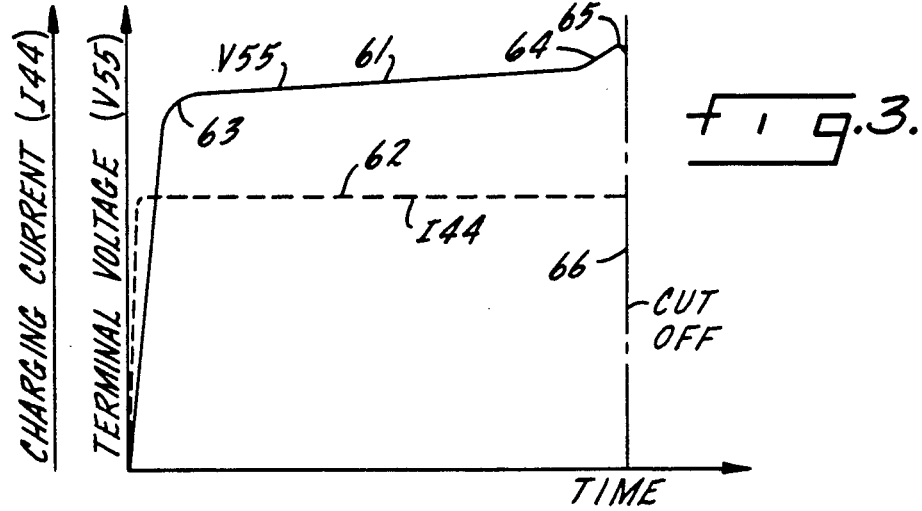
FIG. 3 is a graph of voltage and current relations versus time, used to explain operation of FIG. 1.

FIG. 3 affords a graphic illustration of the foregoing operation. In that figure, the battery terminal voltage V55 is plotted as a function of time, in the solid line curve 61. Similarly, the charging current I44 is illustrated as a function of time by the dash line curve 62. Charging current I44, of course, increases precipitately from time zero, reaching a constant level; it will be remembered that the rectifier and charge current circuit 42 (FIG. 1) is preferably a constant current supply. The battery terminal voltage V55, however, follows a more complex characteristic. It too increases very rapidly in the first moments of charging of device 41. In a short time interval, however, the storage device terminal voltage V55 passes a "knee" 63 in curve 61 and continues with a rather gradually increasing slope. Ultimately, as storage device 41 nears its full charge status, voltage V55 again increases in slope as indicated at 64. Shortly thereafter, however, a minute drop 65 in the main voltage signal or terminal voltage V55 occurs. As noted above, this voltage drop 65, which is exaggerated in FIG. 3, is usually due to a combination of effects, including electrode polarization and some thermal effects. It occurs appreciably earlier than any measureable increase in external temperature of storage device 41, well before the storage device can be damaged by overcharging. Upon occurrence of the voltage downturn 65, the output 54 from operational amplifier U2 goes positive and charging is cut off as indicated by line 66 in FIG. 3.

Figure 4:
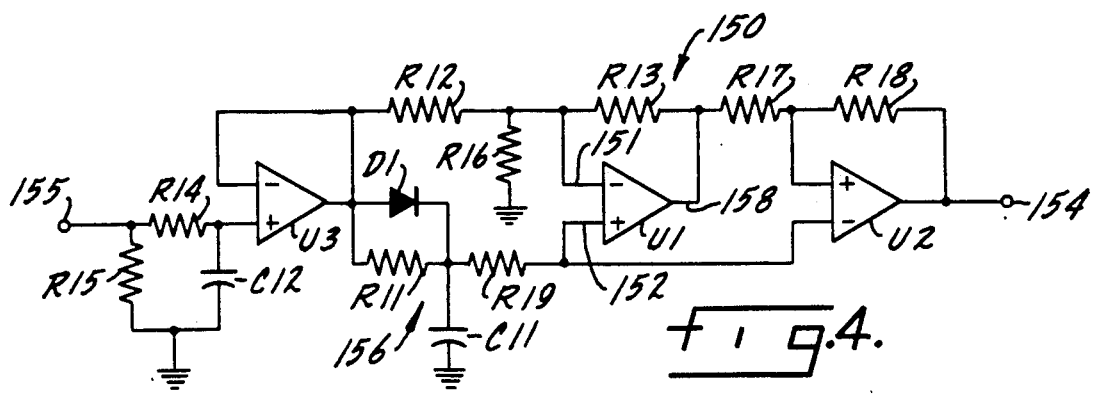
FIG. 4 is a schematic diagram of another embodiment of the monitor circuit of the invention.

FIG. 4 illustrates a monitor circuit 150 that includes a number of modifications to the monitor circuit 50 of FIG. 2. Not all of the modifications shown in FIG. 4 need be present for the others to be useful, nor for the circuit to be operational as described above.

The current impressed upon battery 41 by rectifier and charge current circuit 42 (FIG. 1) frequently includes some pulsation, usually at a frequency of 60 or 120 Hz, superimposed upon the DC charging current flowing to battery 41 through outputs 44 and 45 of circuit 42. It is usually best to filter out this pulsation before going forward with the critical comparison operation of monitor circuit 50. This is accomplished in the modified monitor circuit 150 of FIG. 4 by an input circuit comprising a series resistor R14 and shut capacitor C12. Because these circuit elements may produce an output of fairly high impedance, considering practical values for a network that filters out 60 Hz noise, they are buffered by an additional amplifier U3. Thus, the main input 155 for monitor circuit 150 is connected, through resistor R14, to the non-inverting input of operational amplifier U3. A resistor R15 provides a DC return path to allow amplifier U3 to settle to a known voltage (in this case ground) in the absence of a battery. In the absence of components R14, C12, and U3, a pulsation of substantial amplitude in the battery charging current might trick the monitor into a premature interruption of charging operations.

In monitor circuit 150, FIG. 4, it will be reconized that resistors R12 and R13 are substituted directly for resistors R2 and R3 of FIG. 2, and that operational amplifier U1 serves the same basic purpose as before, having the inputs 151 and 152 and the outputs 158. In circuit 150, however, an additional resistor R16 is connected from terminal 151, the junction of resistors R12 and R13, to system ground. Resistor R16, in conjunction with resistor R12, diminishes the undelayed terminal voltage signal for storage device 41 (FIG. 1) at the inverting input terminal 151 of amplifier U1 by a very small measure. To this end, resistor R16 should have a resistance many times greater than resistor R12. In this way, monitor circuit 150 is biased slightly in favor of cutting off the battery charging current as a safety factor to preclude damage to storage device 41 from any overcharging.

Another pair of resistors R17 and R18 are incorporated in monitor circuit 150, FIG. 4. They form a hysteresis network that allows the signal from the output 158 of amplifier U1 to undergo some degree of vacilliation before triggering comparator U2. If a hysteresis circuit of this kind is employed, the amount of hysteresis should be kept quite small; this is accomplished by choosing resistor R18 so that it is very much larger than resistor R17. The amount of hysteresis is proportional to the difference between the "rail" voltages at the output of operational amplifier U2 and its inputs multiplied by the ratio R17/R18. With resistor R18 much larger than resistor R17, the hysteresis is therefore quite small. The hysteresis should be significantly smaller than the signal swing anticipated at the output 158 of amplifier U1 as required for cut-off.

The delay circuit 156 in the monitor 150 of FIG. 4 includes a resistor R11 and capacitor C11 which function in the same manner as the components R1 and C1 of FIG. 2. In the circuit of FIG. 4, however, a diode D1 is connected in parallel with resistor R11. The presence of diode D1 permits the voltage on capacitor C11 to rise rapidly when a battery or other storage device is first connected in the charging circuit. This can be important, particularly in the case where an already-charged storage device is connected in the circuit for additional charging. The charge on capacitor C11 should rise quickly enough so that the very early decline in terminal voltage for the battery being charged, due to overlapping, can be detected immediately, thereby avoiding the erroneous and potentially harmful process of a continued overcharge.

One additional modification in monitor circuit 150 of FIG. 4, as compared with the circuit 50 of FIG. 2, is the incorporation of a series resistor R19 in the circuit constituting the output from delay circuit 156. That is, resistor R19 is connected in the circuit that constitutes the non-inverting input 152 to amplifier U1 and the inverting input to amplifier U2. The purpose of resistor R19 is to limit current to these inputs of devices U1 and U2, from a charge on capacitor C11, in the event that the power supply (not shown) for operational amplifiers U1 and U2 is interrupted. In some types of operational amplifier, such a power supply interruption can lead to default conduction through the semiconductor substrate which, if not limited, can create appreciable damage.

The monitor circuits 50 and 150 are not limited to utilization in determining the cutoff for charging of a nickel cadmium battery or other storage device 41, though that is certainly a primary utility for these monitors. Thus, the output of the monitor (terminal 54 or 154) is continuously representative of a comparison of the input voltage signal with the value of the same signal for a prior time, the time interval being determined by the delay circuit in the monitor. Applications for any on-going process in which it is important to know the direction and amplitude of changes of a voltage signal will be apparent.

Circuit parameters for typical monitor circuits 50 and 150 are set forth below; it should be understood that these are provided for purposes of express disclosure of particular embodiments, and not as a limitation on the circuits of the invention.

|  | Amplifiers |
| --- | --- |
| U1, U2, and U3 | Parts of a dual or quad FED input, preferably a quad OP-AMP LF 347. |
|  | Capacitors |
| C1 | 100 microfarads |
| C11 | 100 microfarads |
| C12 | 0.22 microfarad |
|  | Resistors |
| R1 | 300 kilohms |
| R2 | 10 kilohms |
| R3 | 30 kilohms |
| R11 | 300 kilohms |
| R12 | 10 kilohms |
| R13 | 30 kilohms |
| R14 | 100 kilohms |
| R15 | 1 megohm |
| R16 | 1 megohm |
| R17 | 10 kilohms |
| R18 | 1 megohm |
| R19 | 10 kilohms |

As applied to charging circuits for individual electrical cells, batteries, and the like, the charge monitors of the present invention are highly useful and effective. A change in the terminal voltage of the storage device that affords a reliable indication of the device reaching a peak charge is identified promptly, well before damage due to overcharging can occur. At the same time, charging of the cell or battery or peak level is also assured. The monitor circuits of the invention achieve this result without regard to errors that might otherwise be caused by circuit calibration, drift, or leakage. The monitors are capable of performing effectively and accurately for widely differing cell types and chemistries, and even appreciably different battery volatages.

The monitor circuitry for a two volt cell is essentially the same as for a nine or twelve volt battery.

I claim:

1. A charge monitor circuit for monitoring variations in the terminal voltage of an electrical energy storage device comprising one or more storage cells in order to control charging of the storage device from a charge circuit supplying a charging current thereto, at least by interrupting the charging current when the storage device reaches a predetermined state of charge, the monitor circuit comprising:

a main input, connectable to the storage device, for receiving an initial signal indicative of the present terminal voltage of the storage device;

comparator circuit means, having first and second inputs and an output, for comparing two input signals to develop an output signal representative of the relationship between the two input signals;

first connection means for connecting the main input to the first input of the comparator circuit means to apply the initial signal thereto;

delay means for delaying a signal for a predetermined brief time interval;

and second connection means for connecting the main input through the delay means to the second input of the comparator circuit means to apply a delayed initial signal thereto;

the comparator output being connectable to the charge circuit.

2. A charge monitor circuit for control of charging of an electrical energy storage device, according to claim 1, in which the comparator circuit means comprises:

an initial stage comprising a differencing amplifier which includes the first and second inputs for the comparator circuit means and an intermediate signal output;

and a secondary stage comprising a comparator amplifier having two inputs, one connected to the intermediate signal output and the other to a selected one of the first and second inputs of the comparator circuit means.

3. A charge monitor circuit for control of charging of an electrical energy storage device, according to claim 2, in which the selected one of the first and second inputs of the comparator circuit means is the second input thereof.

4. A charge monitor circuit for control of charging of an electrical energy storage device, according to claim 3, in which the initial stage of the comparator circuit means is a gain block having substantial gain.

5. A charge monitor circuit for control of charging of an electrical energy storage device, according to claim 3, in which each stage of the comparator circuit means is an operational amplifier, and in which:

the initial signal is applied to the one input of the operational amplifier in the initial stage;

the delay means is connected to the other input of the initial stage amplifier and to the one input of the operational amplifier in the secondary stage;

and the intermediate signal output is connected to the other input of the secondary amplifier.

6. A charge monitor circuit for control of charging of an electrical energy storage device, according to claim 5, in which:

the one input of the operational amplifier in each stage of the comparator circuit means is its inverting input.

7. A charge monitor circuit for control of charging of an electrical energy storage device, according to claim 5, and further comprising:

an input resistor R2 in series with the one input to the initial stage;

and a feedback resistor R3 connected from the intermediate signal output back to the one input of the initial stage;

and $R3 > R2$.

8. A charge monitor circuit for control of charging of an electrical energy storage device, according to claim 7, in which:

the one input of the operational amplifier in each stage of the comparator circuit means is its inverting input.

9. A charge monitor circuit for control of charging of an electrical energy storage device, according to claim 7, in which the one input to the initial stage is returned to a reference potential through a shunt resistor, and the shunt resistor is very much larger than the series input resistor.

10. A charge monitor circuit for control of charging of an electrical energy storage device, according to claim 9, in which:

the one input of the operational amplifier in each stage of the comparator circuit means is its inverting input.

11. A charge monitor circuit for control of charging of an electrical energy storage device, according to claim 10, and further comprising:

a filter circuit, interposed between the main input and the first and second connection means, for filtering out any pulsations in the initial signal prior to its application to the first input of the comparator circuit means or to the delay means;

an initial stage comprising a differencing amplifier which includes the first and second inputs for the comparator circuit means and intermediate signal output;

and a secondary stage comprising a comparator amplifier having two inputs, one connected to the intermediate signal output and the other to a selected one of the first and second inputs of the comparator circuit means;

a buffer amplifier interposed between the filter circuit and the first and second connection means;

and a diode connected in parallel with the delay means so that the preliminary delay, upon initiation of the initial signal, is foreshortened in time to provide for an accelerated response by the comparator circuit means.

12. A charge monitor circuit for control of charging of an electrical energy storage device, according to claim 2, in which the connection between the initial and secondary stages comprises a hysteresis network to preclude false triggering of the secondary stage.

13. A charge monitor circuit for control of charging of an electrical energy storage device, according to claim 12, in which the selected one of the first and second inputs of the comparator circuit means is the second input thereof;

in which each stage of the comparator circuit means is an operational amplifier, and in which:

the initial signal is applied to the one input of the operational amplifier in the initial stage;

the delay means is connected to the other input of the initial stage amplifier and to the one input of the operational amplifier in the secondary stage;

the intermediate signal output is connected to the other input of the secondary stage amplifier;

and the one input of the operational amplifier in each stage of the comparator circuit means is its inverting input.

14. A charge monitor circuit for control of charging of an electrical energy storage device according to claim 1, and further comprising:

a filter circuit, interposed between the main input and the first and second connection means, for filtering out any pulsations in the initial signal prior to its application to the first input of the comparator circuit means or to the delay means.

15. A charge monitor circuit for control of charging of an electrical energy storage device, according to claim 14, in which the comparator circuit comprises:

an initial stage comprising a differencing amplifier which includes the first and second inputs for the comparator circuit means and an intermediate signal output;

and a secondary stage comprising a comparator amplifier having two inputs, one connected to the intermediate signal output and the other to a selected one of the first and second inputs of the comparator circuit means;

and further comprising a buffer amplifier interposed between the filter circuit and the first and second connection means.

16. A charge monitor circuit for control of charging of an electrical energy storage device, according to claim 15, in which the selected one of the first and second inputs of the comparator circuit means is the second input thereof, in which each stage of the comparator circuit means is an operational amplifier, and in which:

the initial signal is applied to the one input of the operational amplifier in the initial stage;

the delay means is connected to the other input of the initial stage amplifier and to the one input of the operational amplifier in the secondary stage;

and the intermediate signal output is connected to the other input of the secondary stage amplifier;

the one input of the operational amplifier in each stage of the comparator circuit means being its inverting input.

17. A charge monitor circuit for control of charging of an electrical energy storage device, according to claim 1, and further comprising a diode connected in parallel with the delay means so that the preliminary delay, upon initiation of the initial signal, is foreshortened in time to provide for an accelerated repsonse by the comparator circuit means.

18. A charge monitor circuit for control of charging of an electrical energy storage device, according to claim 17, in which the comparator circuit means comprises:

an initial stage comprising a differencing amplifier which includes the first and second inputs for the comparator circuit means and an intermediate signal output;

and a secondary stage comprising a comparator amplifier having two inputs, one connected to the intermediate signal output and the other to a selected one of the first and second inputs of the comparator circuit means.

19. A charge monitor circuit for control of charging of an electrical energy storage device, according to claim 18, in which the selected one of the first and second inputs of the comparator circuit means is the second input thereof, in which each stage of the comparator circuit means is an operational amplifier, and in which:

the initial signal is applied to the one input of the operational amplifier in the initial stage;

the delay means is connected to the other input of the initial stage amplifier and to the one input of the operational amplifier in the secondary stage;

and the intermediate signal output is connected to the other input of the secondary stage amplifier;

the one input of the operational amplifier in each stage of the comparator circuit means being its inverting input.

20. A monitor circuit for monitoring variations in an initial signal with respect to direction and amplitude, as a function of time comprising:

a main input for receiving an initial signal;

comparator circuit means, having first and second inputs and an output, for comparing two signals to develop an output signal representative of the relationship between the two input signals;

first connection means for connecting the main input to the first input of the comparator circuit means to apply the initial signal thereto;

delay means for delaying a signal for a predetermined brief time interval;

and second connection means for connecting the main input through the delay means to the second input of the comparator circuit means to apply a delayed initial signal thereto.

21. A monitor circuit according to claim 20, in which the comparator circuit means comprises:

an initial stage comprising a differencing amplifier which includes the first and second inputs for the comparator circuit means and an intermediate signal output;

and a secondary stage comprising a comparator amplifier having two inputs, one connected to the intermediate signal output and the other to a selected one of the first and second inputs of the comparator circuit means.

22. A monitor circuit according to claim 21, in which the selected one of the first and second inputs of the comparator circuit means is the second input thereof, and in which:

the initial signal is applied to the one input of the operational amplifier in the initial stage;

the delay means is connected to the other input of the initial stage amplifier and to the one input of the operational amplifier in the secondary stage;

and the intermediate signal output is connected to the other input of the secondary stage amplifier.

23. A charge monitor circuit for control of charging of an electrical energy storage device, according to claim 22, in which:

the one input of the operational amplifier in each stage of the comparator circuit means is its inverting input; and the initial stage of the comparator circuit means is a gain block having substantial positive gain.

24. A monitor circuit according to claim 22, and further comprising:

an input resistor R2 in series with the one input to the initial stage;

and a feedback resistor R3 connected from the intermediate signal output back to the one input of the initial stage;

and R3>R2.

25. A monitor circuit according to claim 24, in which the one input to the initial stage is returned to a reference potential through a shunt resistor, and the shunt resistor is very much larger than the series input resistor.

26. A monitor circuit according to claim 21, in which the connection between the initial and secondary stages comprises a hysteresis network to preclude false triggering of the secondary stage.

27. A monitor circuit according to claim 20, and further comprising:

a filter circuit, interposed between the main input and the first and second connection means, for filtering out any pulsations in the initial signal prior to its application to the first input of the comparator circuit means or to the delay means.

28. A monitor circuit according to claim 20 and further comprising a diode connected in parallel with the delay means so that the preliminary delay, upon initiation of the initial signal, is foreshortened in time to provide for an accelerated response by the comparator circuit means.

* * * * *